(12) United States Patent
Lv

(10) Patent No.: US 10,565,912 B2
(45) Date of Patent: Feb. 18, 2020

(54) ELECTRICAL CHARACTERISTICS INSPECTION METHOD

(71) Applicant: WUHAN CHINA STAR OPTOELECTRONICS SEMICONDUCTOR DISPLAY TECHNOLOGY CO., LTD., Wuhan, Hubei (CN)

(72) Inventor: Linhong Lv, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 267 days.

(21) Appl. No.: 15/740,149

(22) PCT Filed: Nov. 27, 2017

(86) PCT No.: PCT/CN2017/113156
§ 371 (c)(1),
(2) Date: Dec. 27, 2017

(87) PCT Pub. No.: WO2019/085101
PCT Pub. Date: May 9, 2019

(65) Prior Publication Data
US 2019/0139468 A1    May 9, 2019

(30) Foreign Application Priority Data

Nov. 6, 2017 (CN) .......................... 2017 1 1077006

(51) Int. Cl.
G09G 3/00      (2006.01)
G01R 1/04      (2006.01)
G09G 3/3225    (2016.01)

(52) U.S. Cl.
CPC .......... *G09G 3/006* (2013.01); *G01R 1/0466* (2013.01); *G09G 3/3225* (2013.01)

(58) Field of Classification Search
CPC ..... G09G 3/006; G09G 3/3225; G01R 1/0466
(Continued)

(56) References Cited

U.S. PATENT DOCUMENTS 10,089,921 B2 * 10/2018 Chaji .................. G09G 3/3291
2005/0258769 A1 * 11/2005 Imamura ............... G09G 3/006
                                                   315/161
(Continued)

FOREIGN PATENT DOCUMENTS

CN     101151540 A    3/2008
CN     102456592 A    5/2012
(Continued)

*Primary Examiner* — Christopher P McAndrew
(74) *Attorney, Agent, or Firm* — Hemisphere Law, PLLC; Zhigang Ma

(57) ABSTRACT

An electrical characteristics inspection method is provided. A pixel compensation circuit of a display panel comprises a plurality of thin film transistors. The method comprises steps of: removing a film layer above a drain electrode of the thin film transistor; cutting the connection between the thin film transistor and the other thin film transistors in the pixel compensation circuit using a first laser, cutting the connection between the thin film transistor and the other pixel circuits using the first laser; inserting a probe into a probing location, and supplying a predetermined voltage to the probe for measuring the electrical characteristics of the thin film transistor. This method allows the probe to more precisely touch the metal layer in the display area. It can test and analyze the electrical characteristics in the dense display area more easily. And further can avoid the electrical effects from other thin film transistors.

16 Claims, 6 Drawing Sheets

(58) Field of Classification Search
USPC .................................................. 324/750.03
See application file for complete search history.

(56) References Cited

U.S. PATENT DOCUMENTS

| | | | | |
|---|---|---|---|---|
| 2007/0159742 A1* | 7/2007 | Iwabuchi | ............... | G09G 3/006 361/54 |
| 2007/0164289 A1* | 7/2007 | Jung | ................ | G02F 1/136204 257/72 |
| 2008/0068324 A1* | 3/2008 | Chung | ................... | G09G 3/006 345/98 |
| 2009/0295423 A1* | 12/2009 | Levey | .................... | G09G 3/006 324/760.01 |
| 2013/0235023 A1* | 9/2013 | Chaji | ................... | G09G 3/3291 345/212 |
| 2013/0257845 A1* | 10/2013 | Chaji | ................... | G09G 3/3291 345/212 |
| 2014/0267683 A1* | 9/2014 | Bibl | ....................... | H01L 51/50 348/87 |
| 2014/0329339 A1* | 11/2014 | Chaji | ..................... | G01R 31/26 438/10 |
| 2014/0374703 A1* | 12/2014 | Jung | ................... | H01L 51/0031 257/40 |
| 2015/0161942 A1* | 6/2015 | Chaji | ................... | G09G 3/3208 345/78 |
| 2015/0325170 A1* | 11/2015 | Jeon | ..................... | G09G 3/3225 345/1.2 |
| 2016/0104411 A1* | 4/2016 | Nathan | ................ | G09G 3/2007 345/690 |
| 2017/0103703 A1* | 4/2017 | Bi | .......................... | G09G 3/006 |
| 2017/0193909 A1* | 7/2017 | Song | ................... | G09G 3/2074 |
| 2018/0090042 A1* | 3/2018 | Lin | ......................... | G09G 3/006 |
| 2018/0174522 A1* | 6/2018 | Lee | ...................... | G09G 3/3258 |

FOREIGN PATENT DOCUMENTS

| | | |
|---|---|---|
| CN | 103680370 A | 3/2014 |
| CN | 104778908 A | 7/2015 |
| CN | 104992960 A | 10/2015 |

\* cited by examiner

ELECTRICAL CHARACTERISTICS INSPECTION METHOD

RELATED APPLICATIONS

The present application is a National Phase of International Application Number PCT/CN2017/113156, filed Nov. 27, 2017, and claims the priority of China Application CN 201711077006.9, filed Nov. 6, 2017.

FIELD OF THE DISCLOSURE

The disclosure relates to a display technical field, and particularly to an electrical characteristics inspection method used in a display panel.

BACKGROUND

In the field of displays, the technology of Active Matrix Organic Light Emitting Diode (AMOLED) has the advantages of broad color gamut, high contrast, energy-saving, and foldability. It is one of the most competitive technology in the new generation of display technology.

In the current technology, the driving circuit of the AMOLED mostly has a 7T1C structure. That is the structure in a pixel compensation circuit includes seven thin film transistors (TFT) and one capacitor. The circuit of the structure not only can effectively compensate the pixel but also can effectively compensate the voltage threshold of the driving TFT to improve the image quality. However, compared with a driving circuit of a liquid crystal display (LCD) having a 1T1C structure, the driving circuit of the AMOLED has the following problems: the structure is complex, there are large amount of TFTs in a limited space, the connection is complicated, and the metal exposed area is too small. As a result, it is more difficult to detect the electrical characteristics of the TFT (such as the drive TFT) in the display area.

SUMMARY

The present invention provides an embodiment of an electrical characteristics inspection method used to measure a pixel compensation circuit of a display panel. The method allows the probe to more precisely touch the metal layer in the display area. It can test and analyze the electrical characteristics in the dense display area more easily. And further can avoid the electrical effects from other thin film transistors.

The present invention provides an embodiment of an electrical characteristics inspection method used to measure the pixel compensation circuit of the display panel. The pixel compensation circuit of the display panel comprises a plurality of thin film transistors. The electrical characteristics inspection method comprises following steps:

It removes a film layer above a drain electrode of the thin film transistor to be tested in the display panel.

It cuts the connection between the thin film transistor to be tested in the pixel compensation circuit and the other thin film transistors in the pixel compensation circuit using a first laser. And it cuts the connection between the thin film transistor to be tested and the other pixel circuits using the first laser.

It inserts a probe into a probing location, and supplying a predetermined voltage to the probe for measuring the electrical characteristics of the thin film transistor to be tested. The probing location comprises at least a first probing location, a second probing location, and a third probing location.

Wherein, the first probing location and the second probing location are the place respectively used for supplying the voltage to a gate and a drain of the thin film transistor to be tested. The third probing location is the place used for supplying the voltage to the emitting signal wire. The emitting signal wire is used for providing a light-emitting signal, the light-emitting signal is a drive signal for lighting the pixels.

In an embodiment, the step for removing the film layer on the drain electrode of the thin film transistor to be tested in the display panel further comprises following steps:

It heats the thin film transistor to be tested.

It drops a concentrated acid on the area of the film layer should be removed when heating the thin film transistor.

It cleans the thin film transistor using an ultrasonic cleaner. Whereby, the film layer above the drain electrode of the thin film transistor to be tested will be removed. The film layer comprises organic film layer and/or inorganic film layer.

In an embodiment, the step for heating the thin film transistor to be tested further comprises:

The thin film transistor to be tested is subjected to a heating process on a heating plate. The operating temperature of the heating process is 180° C. The operation time of the heating process has the range from 25 minutes to 30 minutes.

In an embodiment, the concentrated acid comprises the concentrated nitric acid.

In an embodiment, the operating temperature for cleaning the thin film transistor is 80° C. The operation time for cleaning the thin film transistor is 10 minutes.

In an embodiment, the wavelength of the first laser is 1064 nm.

In an embodiment, the step for inserting the probe into the probing location, and supplying the predetermined voltage to the probe to measure the electrical characteristics of the thin film transistor to be tested comprises following steps:

It respectively inserts a first probe, a second probe, a third probe, and a fourth probe into the first probing location, the second probing location, the third probing location, and a fourth probing location. The fourth probing location is used to supply the voltage for the source of the thin film transistor to be tested.

It supplies a first cyclic voltage to the first probe. It supplies a first voltage to the second probe. It supplies a first negative voltage to the third probe. And then, it supplies a second voltage to the fourth probe. With this step the method will get a first electrical characteristics curve.

It supplies the first cyclic voltage to the first probe. It supplies the third voltage to the second probe. It supplies the first negative voltage to the third probe. And then, it supplies the second voltage to the fourth probe. With this step the method will get a second electrical characteristics curve.

By comparing the first electrical characteristics curve and the second electrical characteristics curve, the electrical characteristics of the thin film transistor to be tested can be analyzed.

In an embodiment, the electrical characteristics inspection method further comprises:

The method welds a gate electrode of the thin film transistor to be tested and a source electrode of the thin film transistor to be tested using a second laser at a fourth probing location. The fourth probing location is the place used for supplying the voltage for the source of the thin film transistor to be tested.

In an embodiment, the wavelength of the second laser is 532 nm.

In an embodiment, the step for inserting the probe into the probing location, and supplying the predetermined voltage to the probe to measure the electrical characteristics of the thin film transistor to be tested comprises following steps:

It respectively inserts a first probe, a second probe, and a third probe into the first probing location, the second probing location, and the third probing location.

It supplies a second cyclic voltage to the first probe, supplying a second negative voltage to the third probe, and supplying a third negative voltage to the second probe, for generating a third electrical characteristics curve. Wherein, the third negative voltage is less than the second negative voltage.

It supplies the second cyclic voltage to the first probe, supplying the second negative voltage to the third probe, and supplying the fourth negative voltage to the second probe, for generating a fourth electrical characteristics curve. Wherein, the fourth negative voltage is less than the second negative voltage.

The method compares the third electrical characteristics curve and the fourth electrical characteristics curve for analyzing the electrical characteristics of the thin film transistor to be tested.

In summary, the embodiments of the present invention are described by the method of removing excess organic film layer and/or inorganic film layer on the metal layer. This method allows the probe to more precisely touch the metal layer in the display area. It can test and analyze the electrical characteristics in the dense display area more easily. In addition, by means of laser cutting, the method further can avoid the electrical effects from other thin film transistors.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
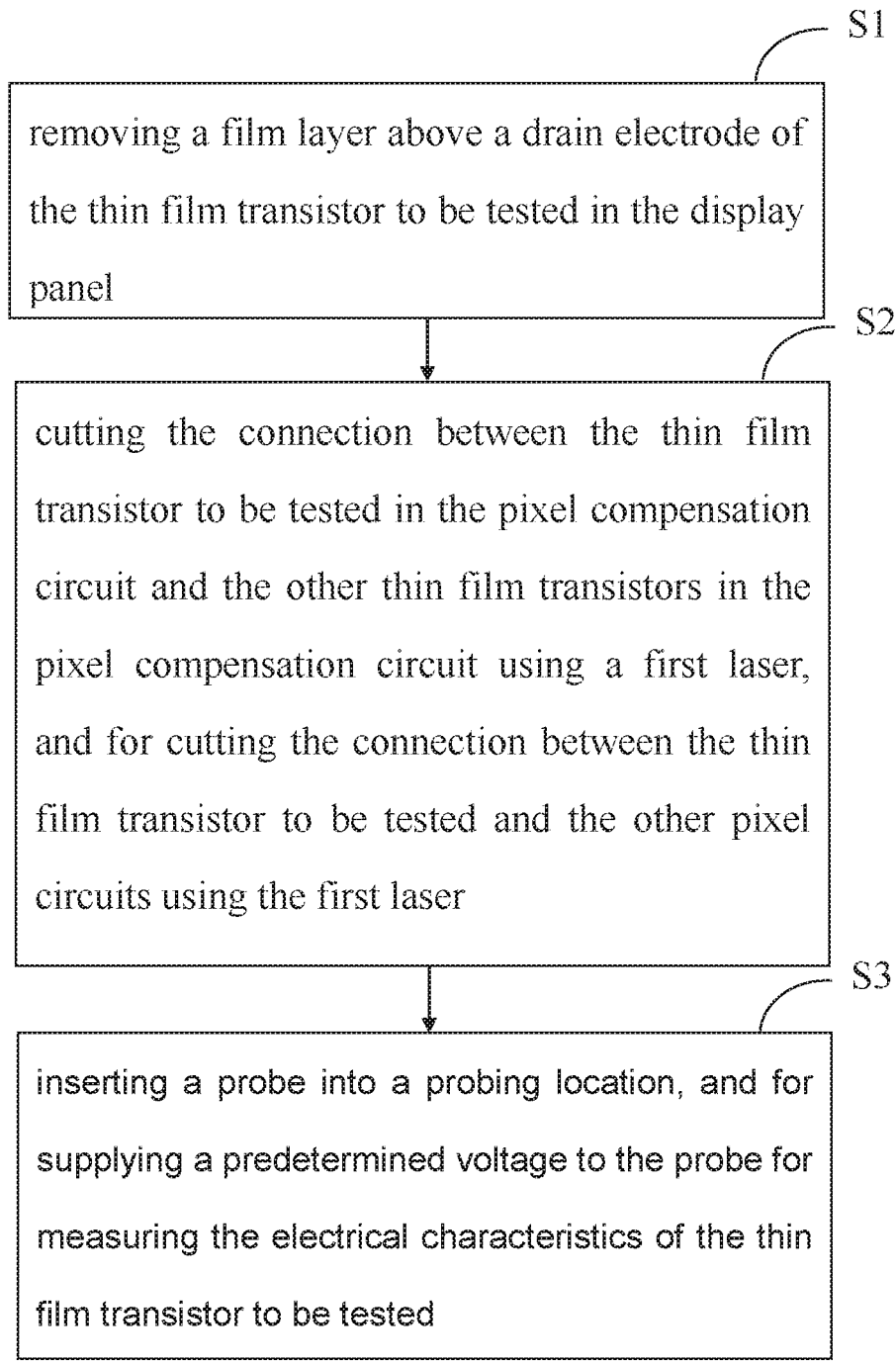
FIG. 1 is a schematic flow chart of the electrical characteristics inspection method applied to a display panel according to an embodiment of the present invention.

The disclosure will be further described in detail with reference to accompanying drawings and preferred embodiments as follows. The specific structural and functional details disclosed herein are only representative and are intended for describing exemplary embodiments of the disclosure. All other embodiments obtained by persons of ordinary skill in the art based on the embodiments of the present invention without creative efforts shall fall within the protection scope of the present invention.

In addition, the following description of the embodiments is given with reference to the appended drawings, for the purpose of illustrating certain embodiments in which the invention may be practiced. In the description of the disclosure, terms such as "above", "below", "front", "rear", "left", "right", "inside", "outside", "lateral", etc. for indicating orientations as shown in the drawings; the terms are used only for describing the present invention and simplifying the description, not for indicating or hinting that the device or element should be in the direction, or should be constructed or manipulated in a specific direction; therefore these terms should not be construed as limitations on the present invention.

In the description of the present invention, it should be noted that unless there are express rules and limitations, the terms such as "mount", "connect" and "bond" should be comprehended in broad sense. For example, it can mean a permanent connection, a detachable connection, or an integrate connection; it can mean a mechanical connection or an electrical connection; it can mean a direct connection, an indirect connection by an intermediate, or an inside connection between two elements. For those skilled in the art, the specific meaning of the above mentioned terms can be construed in specific situations.

Moreover, in the present application description, the term "multiple", "more" or "plurality" means two or more, unless otherwise expressly specifically limited. If the term "working procedure" is used in the description, the term does not merely signify an independent working procedure, and also include any procedure or process that is capable of achieving the anticipated effect of this working procedure in case of failure to distinguishing this specific working procedure from the other working procedures. In addition, the "en dash" used in the description denotes a value range in which the values given at a left end and a right end of the "en dash" are respectively used as a minimum value and a maximum value. In the attached drawings, like reference signs are used to denote units having similar or identical structure.

The present invention provides an embodiment of electrical characteristics inspection method used to measure a pixel compensation circuit of a display panel. By removing excess organic film layer and/or inorganic film layer on a metal layer, the method allows the probe to more precisely touch the metal layer in the display area. It can test and analyze the electrical characteristics in the dense display area more easily. In addition, by means of laser cutting, the method further can avoid the electrical effects from other thin film transistors. The electrical characteristics inspection method applied to a display panel according to the embodiments of the present invention will be described following in detail with reference to FIG. 1 through FIG. 6.

Referring to FIG. 1, FIG. 1 is a schematic flow chart of the electrical characteristics inspection method applied to the display panel according to an embodiment of the present invention. The electrical characteristics inspection method of the embodiment of the invention comprises the following steps:

Step S1: The step of the method is for removing a film layer above a drain electrode of the thin film transistor to be tested in the display panel.

In the embodiment of the present invention, the display panel comprises a plurality of pixel compensation circuits. Each of the pixel compensation circuit comprises a plurality of thin film transistors (TFT). In an embodiment, each of the pixel compensation circuit has a set of 7T1C structure. That is the structure in each pixel compensation circuit includes seven thin film transistors (TFT) and one capacitor.

Figure 2:
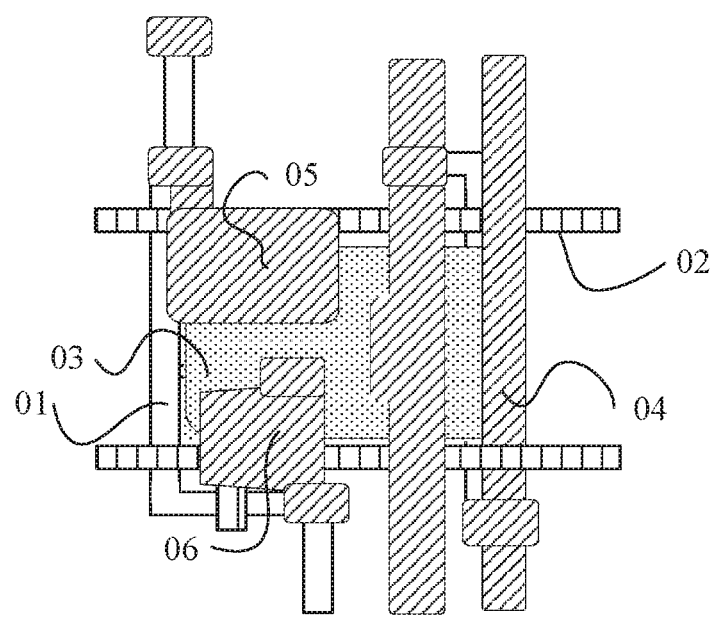
FIG. 2 is a circuit schematic diagram of the pixel compensation circuit according to an embodiment of the present invention.

In the embodiment of the present invention, the circuit diagram of the thin film transistor to be tested in the pixel compensation circuit is shown in FIG. 2. The pixel compensation circuit comprises the thin film transistor 01 to be tested, a first metal wire 02, a second metal wire 03, a third metal wire 04, and an anode (not shown in the figure). The first metal wire 02 forms the gate electrode of the thin film transistor 01 to be tested. The second metal wire 03 forms a capacitance with the first metal wire 02. The third metal wire 04 forms the source electrode and a drain electrode of the thin film transistor 01 to be tested. An insulating layer (not shown) exists between the thin film transistor 01, the first metal wire 02, the second metal wire 03, and the third metal wire 04. Where, the first connecting position 05 is the position where the third metal wire 04 connects to the anode. The first connecting position 05 is for transmitting the power voltage VDD to the anode. The second connecting position 06 is the position where the third metal wire 04 connects to the first metal wire 02. The second connecting position 06 is used for transmitting the electric potential from the third metal wire 04 to the gate electrode of the thin film transistor 01 to be tested. In the embodiment of the present invention, the area of the third metal wire 04 located at the first connecting position 05 and the second connecting position 06 is larger.

Figure 3:
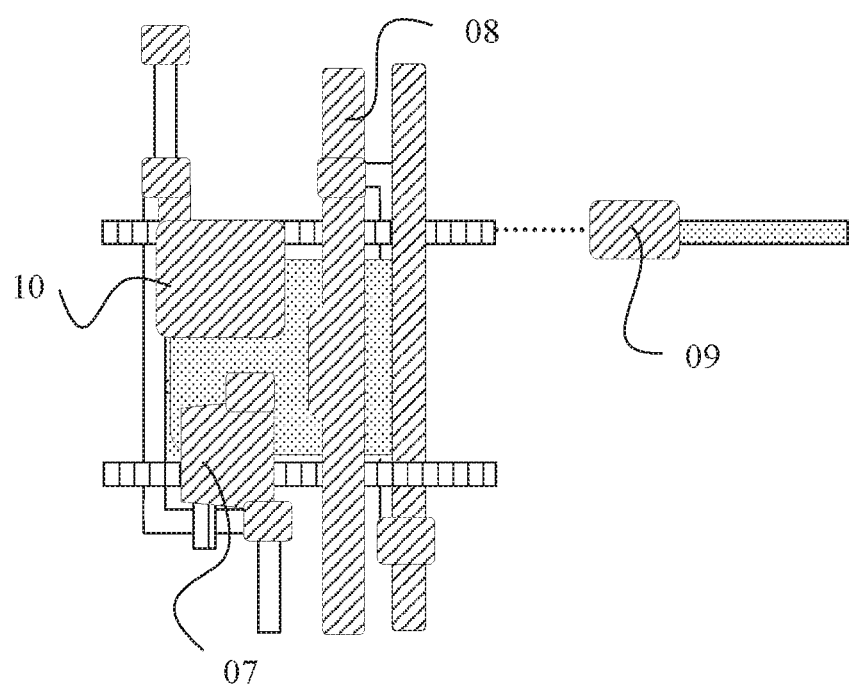
FIG. 3 is a top schematic view of the location touched by the probe according to the embodiment of the present invention.

Referring to FIG. 2 and FIG. 3, the top view of the probing location is shown in FIG. 3 when tests the electrical characteristics of the thin film transistor 01 to be tested using a four-point probe measurement. A first probing location 07 is used to provide the voltage for the gate of the thin film transistor 01 to be tested. A second probing location 08 is used to provide the voltage for the drain of the thin film transistor 01 to be tested. A third probing location 09 is used to provide the voltage for an emitting signal wire. A fourth probing location 10 is used to provide the voltage for the source of the thin film transistor 01 to be tested. The emitting signal wire is used for providing the light-emitting signal. The light-emitting signal is used to turn on the pixel to emit light.

Figure 4:
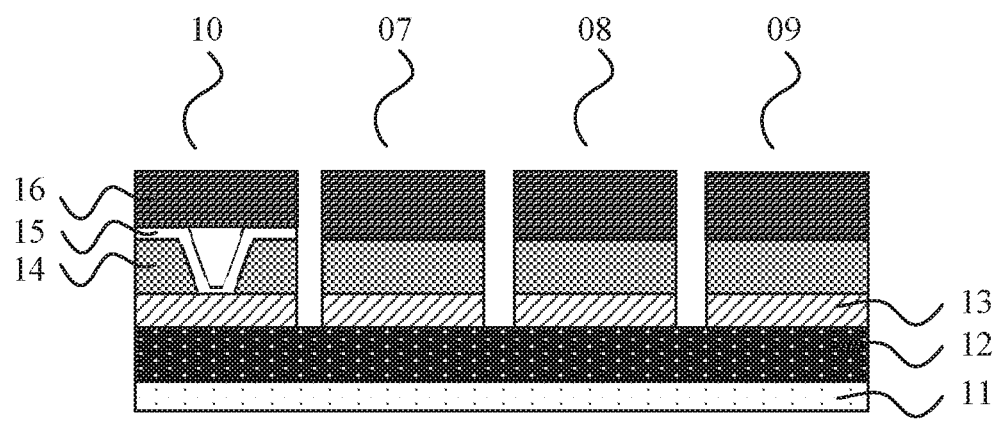
FIG. 4 is a cross-sectional schematic view of the location touched by the probe before removing the film layer according to an embodiment of the present invention.

Referring to FIG. 3 and FIG. 4, the cross-sectional schematic view of the probing location is shown in FIG. 4 when tests the electrical characteristics of the thin film transistor 01 to be tested using a four-point probe measurement. In an embodiment of the present invention, the display panel comprises an array substrate 11, a film layer 12, and a metal layer 13 where the third metal wire 04 is located. The film layer 12 is disposed above the array substrate 11 and under the third metal wire 04. An organic film layer 14, an anode layer 15 and an inorganic film layer 16 are sequentially disposed above the metal layer 13.

In order to test the electrical characteristics of the thin film transistor 01 to be tested, in the embodiment of the present invention, the organic film layer 14 and the inorganic film layer 16 located above the third metal wire 04 are removed in advance, and the third metal wire 04 completely exposed.

In the embodiment of the present invention, the first step of the method is heating the thin film transistor 01 to be tested. In a specific embodiment, the thin film transistor 10 to be tested is subjected to a heating process on a heating plate. The operating temperature of the heating process is 180° C. The operation time of the heating process has the range from 25 minutes to 30 minutes.

During the heating process above mention, the step for dropping a concentrated acid on the area of the film layer should be removed is respectively dropping the concentrated acid on the area where the first probing location 07, the second probing location 08, the third probing location 09, and the fourth probing location 10 is located. In a specific embodiment, the concentrated acid comprises the concentrated nitric acid.

After the heating process, the step of the method is cleaning the thin film transistor 01 using an ultrasonic cleaner. In a specific embodiment, the operating temperature for cleaning the thin film transistor is 80° C. The operation time for cleaning the thin film transistor is 10 minutes.

Figure 5:
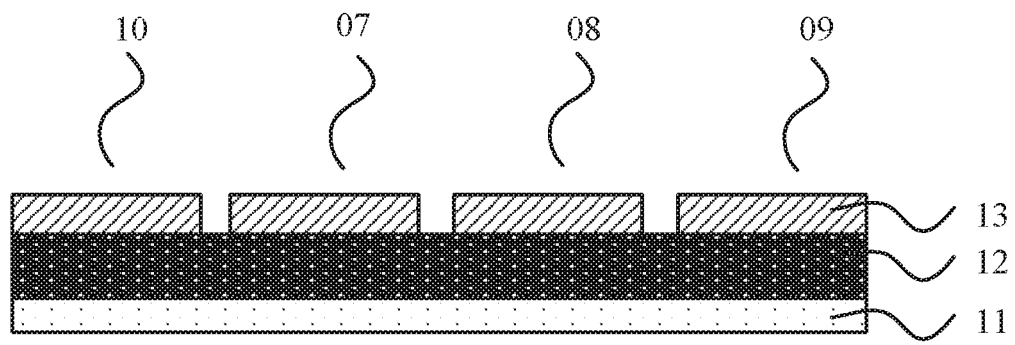
FIG. 5 is a cross-sectional schematic view of the location touched by the probe after removing the film layer according to an embodiment of the present invention.

The film layer is removed by the chemistry (i.e. concentrated acid) described in the above heating and cleaning process. The organic film layer 14 and the inorganic film layer 16 located above the third metal wire 04 are removed. The third metal wire 04 will therefore be completely exposed. After the organic film layer 14 and the inorganic film layer 16 are removed, the cross-sectional view of the location touched by the probe is as shown in FIG. 5.

Step S2: The step of the method is for cutting the connection between the thin film transistor to be tested in the pixel compensation circuit and the other thin film transistors in the pixel compensation circuit using a first laser, and for cutting the connection between the thin film transistor to be tested and the other pixel circuits using the first laser.

Figure 6:
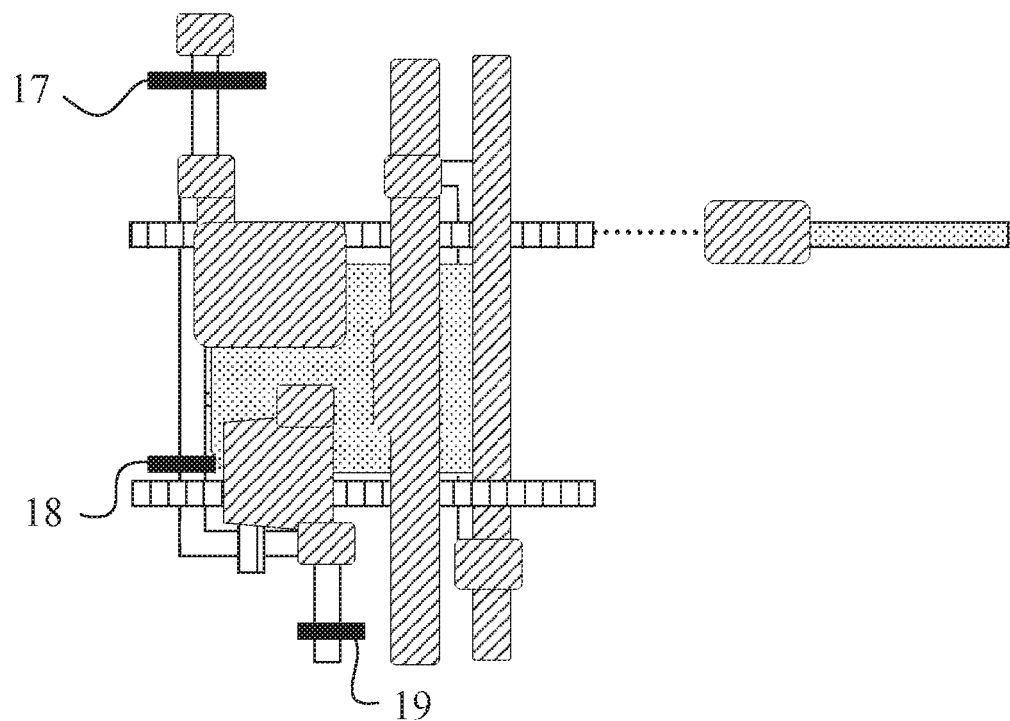
FIG. 6 is a schematic diagram of the position cut by a laser according to an embodiment of the present invention.

Referring to FIG. 3 and FIG. 6, when the pixel compensation circuit of the display panel in this embodiment includes seven thin film transistors, and the thin film transistor 01 to be tested is a drive thin film transistor within, the cutting position of the first laser light is as shown in FIG. 6. A first cutting position 17 means the connection between the pixel (for example, the pixel driving circuit) where the thin film transistor 01 to be tested is located and other pixels (for example, other pixel driving circuits) needs to be disconnected. A second cutting position 18 means the connection between the thin film transistor 01 to be tested and a dual gate thin film transistor needs to be disconnected. The third cutting position 19 means the connection between the thin film transistor 01 to be tested and any one of the five thin film transistors other than the above.

In an embodiment of the present invention, the first cutting position 17, the second cutting position 18 and the third cutting position 19 are subjected to the cutting operation using the first laser. In a specific embodiment, the wavelength of the first laser is 1064 nm.

Step S3: The step of the method is for inserting a probe into a probing location, and for supplying a predetermined voltage to the probe for measuring the electrical characteristics of the thin film transistor to be tested.

When the method tests the electrical characteristics of the thin film transistor 01 to be tested using a four-point probe measurement. The probing location comprises the first probing location 07, the second probing location 08, the third probing location 09, and the fourth probing location 10. Wherein, the step for inserting the probe into the probing location, and supplying the predetermined voltage to the probe to measure the electrical characteristics of the thin film transistor to be tested comprises following steps:

The step of this method is respectively inserting a first probe, a second probe, a third probe, and a fourth probe into the first probing location 07, the second probing location 08, the third probing location 09 and the fourth probing location 10.

It is supplying a first cyclic voltage to the first probe, supplying a first negative voltage to the third probe, supplying a second voltage to the fourth probe, and supplying a first voltage and the third voltage to the second probe, for generating a first electrical characteristics curve and a second electrical characteristics curve. In a specific embodiment, the first cyclic voltage has the voltage range of −15 V to 15V. And the voltage interval of the first cyclic voltage is 0.2V. The voltage value of the first negative voltage is −9V. The voltage value of the first voltage is 0V. The voltage value of the second voltage is 0.1V. The voltage value of the third voltage is 10V.

The method uses comparing the first electrical characteristics curve and the second electrical characteristics curve, for analyzing the electrical characteristics of the thin film transistor 01 to be tested.

In a specific embodiment, the electrical characteristics inspection method further comprises following step: It is for welding the first metal wire 02 and the third metal wire 04 using a second laser at a fourth probing location 10. In a specific embodiment, the second laser has a wavelength of 532 nm.

When the first metal wire 02 and the third metal wire 04 are welded together at the fourth probing location 10, the signal in the third probe can be transmitted to the source of the thin film transistor 01 to be tested. Therefore, it is also possible to test the electrical characteristics of the thin film transistor to be tested using only the first probe, the second probe, and the third probe (also referred to as a three-point probe measurement).

When the method tests the electrical characteristics of the thin film transistor 01 to be tested using the three-point probe measurement. Wherein, the step for inserting the probe into the probing location, and supplying the predetermined voltage to the probe to measure the electrical characteristics of the thin film transistor to be tested comprises following steps:

The step of the method is respectively inserting the first probe, the second probe, and the third probe into the first probing location 07, the second probing location 08, and the third probing location 09.

The step of the method is supplying the second cyclic voltage to the first probe, supplying the second negative voltage to the third probe, and supplying the third negative voltage and the fourth negative voltage to the second probe, for generating a third electrical characteristics curve and a fourth electrical characteristics curve. Wherein, the third negative voltage and the fourth negative voltage are respectively less than the second negative voltage. In a specific embodiment, the second cyclic voltage has the voltage range of −15V to 15V. And the voltage interval of the second cyclic voltage is 0.2V. The voltage value of the second negative voltage is −9V.

The method uses comparing the third electrical characteristics curve and the fourth electrical characteristics curve, for analyzing the electrical characteristics of the thin film transistor 01 to be tested.

The embodiments of the present invention are described by the method of increasing the area of the metal wire and removing excess organic film layer and/or inorganic film layer on the metal layer. This method allows the probe to more precisely touch the metal layer in the display area. It can test and analyze the electrical characteristics in the dense display area more easily. In addition, by means of laser cutting, the electrical characteristics inspection method further can avoid the electrical effects from other thin film transistors.

In the description of the present specification, reference to the term "one embodiment," "some embodiments", "an example", "specific example", or "some examples" etc., means that a particular feature of the described embodiments or examples described structure, material, or characteristic included in the present invention, at least one embodiment or example. In the present specification, the terms of the above schematic representation is not necessarily referring to the same embodiment or example. Furthermore, the particular features, structures, materials, or characteristics described in any one or more embodiments or examples in proper manner.

The foregoing contents are detailed description for the electrical characteristics inspection method applied to the display panel provided in the embodiments of the present invention. Specific examples are used herein to describe the principle and implementation manners of the present invention. The description of the foregoing embodiments is merely intended to help understanding the method of the present invention and its main technology. For the person skilled in the art of the disclosure, without departing from the concept of the disclosure, simple deductions or substitutions can be made and should be included in the protection scope of the application. In summary, the contents of the specification should not be construed as limiting the present invention.

What is claimed is:

1. An electrical characteristics inspection method, used to measure a pixel compensation circuit of a display panel, the pixel compensation circuit of the display panel comprising a plurality of thin film transistors, the electrical characteristics inspection method comprising:

removing a film layer above a drain electrode of the thin film transistor to be tested in the display panel;

cutting the connection between the thin film transistor to be tested in the pixel compensation circuit and the other thin film transistors in the pixel compensation circuit using a first laser, and cutting the connection between the thin film transistor to be tested and the other pixel circuits using the first laser; and inserting a probe into a probing location, and supplying a predetermined voltage to the probe for measuring the electrical characteristics of the thin film transistor to be tested, the probing location comprising at least a first probing location, a second probing location and a third probing location;

wherein the first probing location and the second probing location are the place respectively used for supplying the voltage to a gate and a drain of the thin film transistor to be tested, the third probing location is the place used for supplying the voltage to the emitting signal wire, the emitting signal wire is used for providing a light-emitting signal, the light-emitting signal is a drive signal for lighting the pixels.

2. The electrical characteristics inspection method according to claim 1, wherein the step for removing the film layer on the drain electrode of the thin film transistor to be tested in the display panel further comprises following steps:

heating the thin film transistor to be tested;

dropping a concentrated acid on the area of the film layer should be removed when heating the thin film transistor; and cleaning the thin film transistor using an ultrasonic cleaner, whereby the film layer above the drain electrode of the thin film transistor to be tested will be removed, the film layer comprising organic film layer and/or inorganic film layer.

3. The electrical characteristics inspection method according to claim 2, wherein the step for heating the thin film transistor to be tested further comprises:

the thin film transistor to be tested being subjected to a heating process on a heating plate, the operating temperature of the heating process being 180° C., the operation time of the heating process having the range from 25 minutes to 30 minutes.

4. The electrical characteristics inspection method according to claim 2, wherein the concentrated acid comprises the concentrated nitric acid.

5. The electrical characteristics inspection method according to claim 2, wherein the operating temperature for cleaning the thin film transistor is 80° C., the operation time for cleaning the thin film transistor is 10 minutes.

6. The electrical characteristics inspection method according to claim 1, wherein the wavelength of the first laser is 1064 nm.

7. The electrical characteristics inspection method according to claim 1, wherein the step for inserting the probe into the probing location, and supplying the predetermined voltage to the probe to measure the electrical characteristics of the thin film transistor to be tested comprises following steps:

respectively inserting a first probe, a second probe, a third probe, and a fourth probe into the first probing location, the second probing location, the third probing location and a fourth probing location, the fourth probing location used to supply the voltage for the source of the thin film transistor to be tested;

supplying a first cyclic voltage to the first probe, supplying a first voltage to the second probe, supplying a first negative voltage to the third probe, and supplying a second voltage to the fourth probe, for generating a first electrical characteristics curve;

supplying the first cyclic voltage to the first probe, supplying the third voltage to the second probe, supplying the first negative voltage to the third probe, and supplying the second voltage to the fourth probe, for generating a second electrical characteristics curve;

comparing the first electrical characteristics curve and the second electrical characteristics curve, for analyzing the electrical characteristics of the thin film transistor to be tested.

8. The electrical characteristics inspection method according to claim 2, wherein the step for inserting the probe into the probing location, and supplying the predetermined voltage to the probe to measure the electrical characteristics of the thin film transistor to be tested comprises following steps:

respectively inserting a first probe, a second probe, a third probe, and a fourth probe into the first probing location, the second probing location, the third probing location and a fourth probing location, the fourth probing location used to supply the voltage for the source of the thin film transistor to be tested;

supplying a first cyclic voltage to the first probe, supplying a first voltage to the second probe, supplying a first negative voltage to the third probe, and supplying a second voltage to the fourth probe, for generating a first electrical characteristics curve;

supplying the first cyclic voltage to the first probe, supplying the third voltage to the second probe, supplying the first negative voltage to the third probe, and supplying the second voltage to the fourth probe, for generating a second electrical characteristics curve;

comparing the first electrical characteristics curve and the second electrical characteristics curve, for analyzing the electrical characteristics of the thin film transistor to be tested.

9. The electrical characteristics inspection method according to claim 3, wherein the step for inserting the probe into the probing location, and supplying the predetermined voltage to the probe to measure the electrical characteristics of the thin film transistor to be tested comprises following steps:

respectively inserting a first probe, a second probe, a third probe, and a fourth probe into the first probing location, the second probing location, the third probing location and a fourth probing location, the fourth probing location used to supply the voltage for the source of the thin film transistor to be tested;

supplying a first cyclic voltage to the first probe, supplying a first voltage to the second probe, supplying a first negative voltage to the third probe, and supplying a second voltage to the fourth probe, for generating a first electrical characteristics curve;

supplying the first cyclic voltage to the first probe, supplying the third voltage to the second probe, supplying the first negative voltage to the third probe, and supplying the second voltage to the fourth probe, for generating a second electrical characteristics curve;

comparing the first electrical characteristics curve and the second electrical characteristics curve, for analyzing the electrical characteristics of the thin film transistor to be tested.

10. The electrical characteristics inspection method according to claim 4, wherein the step for inserting the probe into the probing location, and supplying the predetermined voltage to the probe to measure the electrical characteristics of the thin film transistor to be tested comprises following steps:

respectively inserting a first probe, a second probe, a third probe, and a fourth probe into the first probing location, the second probing location, the third probing location and a fourth probing location, the fourth probing location used to supply the voltage for the source of the thin film transistor to be tested;

supplying a first cyclic voltage to the first probe, supplying a first voltage to the second probe, supplying a first negative voltage to the third probe, and supplying a second voltage to the fourth probe, for generating a first electrical characteristics curve;

supplying the first cyclic voltage to the first probe, supplying the third voltage to the second probe, supplying the first negative voltage to the third probe, and supplying the second voltage to the fourth probe, for generating a second electrical characteristics curve;

comparing the first electrical characteristics curve and the second electrical characteristics curve, for analyzing the electrical characteristics of the thin film transistor to be tested.

11. The electrical characteristics inspection method according to claim 5, wherein the step for inserting the probe into the probing location, and supplying the predetermined voltage to the probe to measure the electrical characteristics of the thin film transistor to be tested comprises following steps:

respectively inserting a first probe, a second probe, a third probe, and a fourth probe into the first probing location, the second probing location, the third probing location and a fourth probing location, the fourth probing location used to supply the voltage for the source of the thin film transistor to be tested;

supplying a first cyclic voltage to the first probe, supplying a first voltage to the second probe, supplying a first negative voltage to the third probe, and supplying a second voltage to the fourth probe, for generating a first electrical characteristics curve;

supplying the first cyclic voltage to the first probe, supplying the third voltage to the second probe, supplying the first negative voltage to the third probe, and supplying the second voltage to the fourth probe, for generating a second electrical characteristics curve;

comparing the first electrical characteristics curve and the second electrical characteristics curve, for analyzing the electrical characteristics of the thin film transistor to be tested.

12. The electrical characteristics inspection method according to claim 6, wherein the step for inserting the probe into the probing location, and supplying the predetermined voltage to the probe to measure the electrical characteristics of the thin film transistor to be tested comprises following steps:

respectively inserting a first probe, a second probe, a third probe, and a fourth probe into the first probing location, the second probing location, the third probing location and a fourth probing location, the fourth probing location used to supply the voltage for the source of the thin film transistor to be tested;

supplying a first cyclic voltage to the first probe, supplying a first voltage to the second probe, supplying a first negative voltage to the third probe, and supplying a second voltage to the fourth probe, for generating a first electrical characteristics curve;

supplying the first cyclic voltage to the first probe, supplying the third voltage to the second probe, supplying the first negative voltage to the third probe, and supplying the second voltage to the fourth probe, for generating a second electrical characteristics curve;

comparing the first electrical characteristics curve and the second electrical characteristics curve, for analyzing the electrical characteristics of the thin film transistor to be tested.

13. The electrical characteristics inspection method according to claim 1, the electrical characteristics inspection method further comprising:

welding a gate electrode of the thin film transistor to be tested and a source electrode of the thin film transistor to be tested using a second laser at a fourth probing location, the fourth probing location used to supply the voltage for the source of the thin film transistor to be tested.

14. The electrical characteristics inspection method according to claim 13, wherein the wavelength of the second laser is 532 nm.

15. The electrical characteristics inspection method according to claim 13, wherein the step for inserting the probe into the probing location, and supplying the predetermined voltage to the probe to measure the electrical characteristics of the thin film transistor to be tested comprises following steps:

respectively inserting a first probe, a second probe, and a third probe into the first probing location, the second probing location, and the third probing location;

supplying a second cyclic voltage to the first probe, supplying a second negative voltage to the third probe, and supplying a third negative voltage to the second probe, for generating a third electrical characteristics curve, the third negative voltage less than the second negative voltage;

supplying the second cyclic voltage to the first probe, supplying the second negative voltage to the third probe, and supplying the fourth negative voltage to the second probe, for generating a fourth electrical characteristics curve, the fourth negative voltage less than the second negative voltage;

comparing the third electrical characteristics curve and the fourth electrical characteristics curve, for analyzing the electrical characteristics of the thin film transistor to be tested.

16. The electrical characteristics inspection method according to claim 14, wherein the step for inserting the probe into the probing location, and supplying the predetermined voltage to the probe to measure the electrical characteristics of the thin film transistor to be tested comprises following steps:

respectively inserting a first probe, a second probe, and a third probe into the first probing location, the second probing location, and the third probing location;

supplying a second cyclic voltage to the first probe, supplying a second negative voltage to the third probe, and supplying a third negative voltage to the second probe, for generating a third electrical characteristics curve, the third negative voltage less than the second negative voltage;

supplying the second cyclic voltage to the first probe, supplying the second negative voltage to the third probe, and supplying the fourth negative voltage to the second probe, for generating a fourth electrical characteristics curve, the fourth negative voltage less than the second negative voltage;

comparing the third electrical characteristics curve and the fourth electrical characteristics curve, for analyzing the electrical characteristics of the thin film transistor to be tested.

* * * * *